United States Patent
Hwang et al.

(10) Patent No.: US 10,241,132 B2
(45) Date of Patent: Mar. 26, 2019

(54) SOCKET APPARATUS FOR SEMICONDUCTOR DEVICE TEST

(71) Applicants: Dong Weon Hwang, Seoul (KR); HICON CO., LTD., Seongnam-si, Gyeonggido (KR); Jae Suk Hwang, Berkeley, CA (US); Jae Baek Hwang, Seoul (KR)

(72) Inventors: Dong Weon Hwang, Seoul (KR); Jae Suk Hwang, Berkeley, CA (US); Jae Baek Hwang, Seoul (KR)

(73) Assignees: Dong Weon Hwang, Seoul (KR); HICON CO., LTD., Seongnam-si, Gyeonggi-do (KR); Jae Suk Hwang, Berkeley, CA (US); Jae Baek Hwang, Seoul (KR)

( * ) Notice: Subject to any disclaimer, the term of this patent is extended or adjusted under 35 U.S.C. 154(b) by 114 days.

(21) Appl. No.: 15/306,151

(22) PCT Filed: Apr. 27, 2015

(86) PCT No.: PCT/KR2015/004141
§ 371 (c)(1),
(2) Date: Oct. 24, 2016

(87) PCT Pub. No.: WO2015/167178
PCT Pub. Date: Nov. 5, 2015

(65) Prior Publication Data
US 2017/0045551 A1    Feb. 16, 2017

(30) Foreign Application Priority Data

Apr. 28, 2014 (KR) .................. 10-2014-0050435

(51) Int. Cl.
*G01R 1/04* (2006.01)
*G01R 1/067* (2006.01)
(Continued)

(52) U.S. Cl.
CPC ....... *G01R 1/0466* (2013.01); *G01R 1/06722* (2013.01); *G01R 31/26* (2013.01); *G01R 31/2891* (2013.01); *G01R 1/0483* (2013.01)

(58) Field of Classification Search
CPC .. G01R 31/2891; G01R 3/00; G01R 31/2889; G01R 1/07378; G01R 31/2886; G01R 1/0466; G01R 1/06722
(Continued)

(56) References Cited

U.S. PATENT DOCUMENTS 5,329,227 A * 7/1994 Sinclair ............... G01R 1/0433
  324/756.02
6,140,828 A * 10/2000 Iino ..................... G01R 31/2887
  324/750.22
(Continued)

FOREIGN PATENT DOCUMENTS

KR  10-2003-0022736 A   3/2003
KR  10-2003-0051371 A   6/2003
(Continued)

*Primary Examiner* — Christopher P McAndrew
(74) *Attorney, Agent, or Firm* — Rabin & Berdo, P.C.

(57) ABSTRACT

Disclosed a socket apparatus for a semiconductor device test, the apparatus including: body elements (100, 200) into which contacts (400) are inserted; movable elements (300, 500) on which a semiconductor device (IC) is seated; a socket cover (600) assembled to the movable elements (300, 500) and resiliently assembled to the body elements (100, 200); and a semiconductor device pressing part (700) pressing and fixing the semiconductor device (IC) seated on the movable elements (300, 500), wherein the semiconductor device pressing part (700) includes: a pusher plate (710) having an opening cam (711) and coming into surface contact with an upper surface of the semiconductor device (IC) and applies pressure thereto; a latch (720) of which ends are hingedly assembled to the socket cover (600) and the pusher plate (710); and a link (730) of which ends are hingedly assembled to the socket body (100) and the latch (720).

20 Claims, 20 Drawing Sheets

(51) Int. Cl.
*G01R 31/26* (2014.01)
*G01R 31/28* (2006.01)

(58) Field of Classification Search
USPC .................................................. 324/754.11
See application file for complete search history.

(56) References Cited

U.S. PATENT DOCUMENTS

| | | | |
|---|---|---|---|
| 6,749,443 B2 | 6/2004 | Sano et al. | |
| 7,837,481 B1* | 11/2010 | Mahoney | H01R 12/7076 439/66 |
| 8,602,805 B2 | 12/2013 | Takahashi et al. | |
| 2003/0054676 A1 | 3/2003 | Sano et al. | |
| 2003/0114034 A1 | 6/2003 | Sano et al. | |
| 2008/0207036 A1* | 8/2008 | Hwang | G01R 1/0483 439/331 |
| 2009/0275220 A1* | 11/2009 | Hwang | G01R 1/0466 439/73 |
| 2011/0215826 A1* | 9/2011 | Hwang | G01R 31/26 324/762.02 |
| 2012/0129379 A1 | 5/2012 | Takahashi et al. | |
| 2013/0088250 A1* | 4/2013 | Seo | G01R 1/0466 324/754.11 |

FOREIGN PATENT DOCUMENTS

| | | |
|---|---|---|
| KR | 20-0425576 Y1 | 9/2006 |
| KR | 10-2012-0054548 A | 5/2012 |
| KR | 10-2013-0135563 A | 12/2013 |
| KR | 10-1345816 B1 | 1/2014 |

* cited by examiner

SOCKET APPARATUS FOR SEMICONDUCTOR DEVICE TEST

TECHNICAL FIELD

The present invention relates generally to a socket apparatus for a semiconductor device test.

BACKGROUND ART

In general, a socket apparatus for testing a semiconductor device (IC) is provided in a test board or a burn-in board. Here, a burn-in chamber that outputs driving power and electric signals, or peripheral devices and an additional apparatus for an IC test, etc. are electrically connected to each other through input and output (I/O) leads of the boards. Thus, the socket apparatus is employed as a system for the IC test.

Among well known and widely used ICs in the electronic industry, a ball grid array (BGA) is a type of the IC that is notable for innovatively reducing a size and thickness thereof by arranging leads of the IC, namely, balls of the IC, on the whole bottom surface of the IC.

In the mean time, a land grid array (LGA) is a type of the IC without having the balls on a pad (or a land) as in the BGA type IC.

Recently, such ICs have been manufactured in a variety of forms including an LGA type IC or a BGA/LGA hybrid IC. Specifically, a socket for testing the LGA type IC or the hybrid type IC is provided with a plurality of contacts having predetermined elasticity in a vertical direction, and the lower leads of the contacts are connected to a printed circuit board (PCB) by contacting or soldering.

Here, the upper leads of the contacts are formed such that they come into contact with the leads of the IC loaded in a socket. Further, the socket should be provided with a pressure device for pressing the IC downwards for achieving stability of electric contact therebetween.

For reference, when physical force applied to the upper surface of the IC by the pressing device is divided by the number of contacts, physical force applied per one contact is calculated.

More specifically, physical force applied to one contact is approximately 10 gf. For example, when the number of leads of the IC is five hundred, it is estimated that physical force of about 5.0 kgf is required to be applied to the IC.

Accordingly, the socket apparatus for testing the IC should be provided with a latch capable of effectively applying strong physical force to the IC as described above.

As there has been a trend towards increasing a lead count, and reducing a lead pitch and thickness of the IC in recent years, it is required that the socket be provided with a pressure means capable of effectively pressurizing and fixing the IC to the socket while maintaining a level position of the entire surface of the IC in response to contact force applied to leads of the IC during a burn-in test at high temperature for a long time.

FIGS. 1a, 1b, and 1c are a plan view, a side view, and a bottom view respectively showing a typical IC. Specifically, the BGA type IC having a lead pitch of 0.35 mm, a lead count of 456, a size of 14×15.5, and thickness of 0.5 mm is shown as a representative IC produced in recent years.

With reference to FIGS. 1a to 1c, an upper surface of a semiconductor device 1 is provided with fine protrusions 2, thereby having a sandpaper-like surface. Further, a lower surface of the semiconductor device 1 is provided with a plurality of balls 3 as leads of the semiconductor device 1.

In the future, it is predicted that thickness of the semiconductor device may be reduced to 0.25 mm, a lead pitch may be reduced to 0.30 mm, 0.25 mm, 0.2 mm, etc., and the lead count may be increased to 500 to about 1000.

FIGS. 2a and 2b are a top plan view and a cross-sectional view taken along line A-A of FIG. 2a respectively showing a socket apparatus for testing a semiconductor device in the related art.

With reference to FIGS. 2a and 2b, the conventional socket apparatus 10 for testing the semiconductor device includes a socket body 11 provided with a plurality of contacts 12 having a curved shape, a cover 13 moving up and down on the socket body 11, and a latch 14 rotatably assembled to the socket body 11 so as to fix or release the semiconductor device 20 in conjunction with up-and-down movement of the cover 13.

The latch 14 is provided with a guide slot 14a to which guide pin 15a is engaged, and the guide pin 15a is fixed to a driving link 15 of which a first end is hinge-coupled to the cover 13. Further, the cover 13 is resiliently supported by a coil spring 16.

In such conventional socket apparatus, when pressing the cover 13, the latch 14 opens outwards, thereby loading the semiconductor device 20 therein. On the other hand, when releasing the cover 13, the latch 14 presses down and fixes an upper surface of the semiconductor device 20 due to resilience of the coil spring 16.

However, a front end of the latch repeatedly presses down and fixes the upper surface of the semiconductor device by applying strong force thereto. Moreover, the upper surface of the semiconductor device is an uneven surface. These result in intensifying abrasion caused at the front end of the latch that comes into contact with the semiconductor device as frequency of a test is increased. Thus, there is a problem in that it is difficult to achieve stability of electric contact between the leads of the semiconductor device and the contacts, and reliability of the test is reduced.

Usually, when tested about fifty thousand times, the socket apparatus reaches a point where it cannot be operated anymore due to abrasion caused at the front end of the latch 17.

Moreover, the conventional socket apparatus for testing the LGA type IC requires additional components to arrange and assemble contacts having a bow-shaped curved portion. Thus, there is a problem in that it is difficult to assemble the contacts due to a plurality of the components thereof. In addition, the conventional socket apparatus requires a structure for pressing and fixing the semiconductor device with strong physical force, and a driving device, thereby further complicating the structure thereof. Particularly, there is a problem in that such a complicated structure leads to an increase in a production cost and reduction in overall quality of the socket apparatus.

Furthermore, as shown in FIG. 2, when using a bow beam contact or a buckle beam contact, there is difficulty in securing insulation between contacts and assembling the socket apparatus. Thus, the socket apparatus is problematic in that the cost thereof is increased and quality thereof is reduced. Moreover, another problem resides in that cracks, deformation, distortion, etc. are caused in a wafer of the IC or the IC after performing a burn-in test for a long time.

RELATED ART DOCUMENT (Patent Document 1) Korean Patent application publication No. 10-2013-0135563 (2013.12.11)

(Patent Document 2) Korean Patent No. 10-1345816 (2014.01.10)

DISCLOSURE

Technical Problem

Accordingly, the present invention has been made keeping in mind the above problems occurring in the related art, and the present invention is intended to propose a socket apparatus for a semiconductor device test, the socket apparatus having a pressure means capable of effectively pressurizing and fixing a semiconductor device to the socket apparatus in consideration of the fact that there has been a trend towards increasing a lead count, and reducing a lead pitch and thickness of the semiconductor device in recent years.

Technical Solution

In order to achieve the above object, according to one aspect of the present invention, there is provided a socket apparatus for a semiconductor device test, the socket apparatus including: socket body 100 provided with a plurality of first receiving holes 101 for receiving contacts therein; a lower plate 200 provided in a lower portion of the socket body 100, the lower plate 200 being provided with a plurality of second receiving holes 201 that is formed through the lower plate 200 and respectively communicates with the first receiving holes 101 such that lower contact portions of the contacts 400 come into electric contact with leads of a printed circuit board PCB; a floating plate 300 supported by a plurality of first elastic materials S1 at an upper location of the socket body 100 so as to be movable up and down, the floating plate 300 having an upper surface serving as a seating surface to seat a semiconductor device thereon, and a plurality of through holes 301 where upper contact portions of the contacts are held therein while passing through the floating plate 300; the plurality of contacts 400 inserted into the first receiving holes 101 and the second receiving holes 201 such that the lower contact portions of the contacts 400 come into contact with the leads of the PCB, and the upper contact portions of the contacts 400 come into contact with leads of the semiconductor device through the through holes 301; an adaptor plate 500 provided on an upper portion of the floating plate 300, the adaptor plate 500 having a guide surface that guides the semiconductor device to be seated on the floating plate 300; a socket cover 600 supported by a plurality of second elastic materials S2 and assembled to the socket body 100 by a plurality of hooks 620 so as to be movable up and down on the socket body 100, the socket cover 600 having an opening 601 such that the semiconductor device is guided along the guide surface to be loaded on the floating plate 300, in which an inner surface of the opening 601 is provided with an opening protrusion 610 formed by protruding therefrom; and a semiconductor pressing part 700 pressing and fixing the semiconductor device seated on the floating plate 300, while the semiconductor pressing part is operated in conjunction with movement of the socket cover 600 between upper and lower positions, in which the semiconductor device pressing part 700 includes: a pusher plate 710 having an opening cam 711 provided on a lower end of the opening protrusion 610 of the socket cover 600 to come into contact with the opening protrusion, thus the pusher plate 710 comes into surface contact with an upper surface of the semiconductor device and applies pressure thereto; a latch 720 of which a first end is hingedly assembled to the socket cover 600 and a second end is hingedly assembled to the pusher plate 710; and a link 730 of which a first end is hingedly assembled to the socket body 100 and a second end is hingedly assembled to the latch 720.

According to another aspect of the present invention, there is provided a socket apparatus for a semiconductor device test, the socket apparatus including: body elements 100 and 200 into which contacts 400 are fixedly inserted; movable elements 300 and 500 on which a semiconductor device IC is seated such that leads of the semiconductor device IC come into contact with upper ends of the contacts 400, the movable elements 300 and 500 being resiliently supported by the body elements 100 and 200 so as to be movable up and down within a preset height range; a socket cover 600 assembled to upper portions of the movable elements 300 and 500 and resiliently assembled to the body elements 100 and 200 so as to be movable up and down; and a semiconductor device pressing part 700 pressing and fixing the semiconductor device IC seated on the movable elements 300 and 500, while the semiconductor pressing part is operated in conjunction with movement of the socket cover 600 between upper and lower positions, in which the semiconductor device pressing part 700 includes: a pusher plate 710 having an opening cam 711 provided on a lower end of an inner wall structure of the socket cover 600 to come into contact with the inner wall structure when the socket cover 600 moves down, thus the pusher plate 710 comes into surface contact with an upper surface of the semiconductor device IC and applies pressure thereto; a latch 720 of which a first end is hingedly assembled to the socket cover 600 and a second end is hingedly assembled to the pusher plate 710; and a link 730 of which a first end is hingedly assembled to the socket body 100 and a second end is hingedly assembled to the latch 720.

In a preferred embodiment of the present invention, a hinge shaft between the pusher plate 710 and the latch 720 may be resiliently supported by a first torsion spring SS1, and in a more preferred embodiment, the pusher plate 710 may include a rotation stop surface 716 that comes into contact with the latch 720 and limits a rotation angle of the pusher plate 710, such that a front end of the pusher plate 710 may be firstly brought into contact with the upper surface of the semiconductor device in an initial stage of pressurizing the semiconductor device.

In a preferred embodiment of the present invention, a hinge shaft between the socket body 100 and the link 730 may be resiliently supported by a second torsion spring SS2, and in a more preferred embodiment, the link 730 may include: two link plates 731 and 732 positioned parallel to each other, the link plates 731 and 732 of which upper and lower ends are provided with hinge holes so as to be assembled to the latch 720 and the socket body 100 respectively by hinge pins; and a fixing plate 733 fixing the link plates 731 and 732 to each other, and having a fixing hole that fixes an end of the second torsion spring SS2 thereto.

In a preferred embodiment of the present invention, a hinge shaft between the body elements 100 and 200 and the link 730 may be resiliently supported by a second torsion spring SS2.

In a preferred embodiment of the present invention, the floating plate 300 of which the seating surface where the semiconductor device is seated thereon may be provided with ball cups 320 formed by indenting the upper surface of the floating plate 300 so as to communicate with the through holes 301 of the floating plate 300 and receive the leads of the semiconductor device therein.

In a preferred embodiment of the present invention, each of the contacts 400 may be integrally formed by stamping a plate material, and may include: an upper head portion 410 having an upper distal end 411 that is formed by protruding upwards; a compression portion 420 formed by spirally bending a strip from an upper shoulder portion 412 that extends downwards from the upper head portion 410; and a lower head portion 430 formed by extending from a lower shoulder portion 432 that extends from a lower end of the compression portion 420, with a lower distal end 431 provided on a lower end of the lower head portion 430, in which the compression portion 420 may be a coil spring.

In a preferred embodiment of the present invention, on a lower surface of the pusher plate 710 that comes into contact with and applies pressure to the semiconductor device, the pusher plate 710 may include a plurality of uneven portions 715 formed along a rotating direction of the pusher plate 710.

In a preferred embodiment of the present invention, the socket body 100 may be mounted to a test board by a plurality of screws, and the contacts 400 may have compressibility and may come into compressive contact with leads of the test board respectively at lower distal ends 431 thereof.

In a preferred embodiment of the present invention, the socket apparatus may further include a guide plate provided at a lower side of the lower plate 200, the guide plate having contact guide holes that guide the contacts 400, in which the contacts 400 may have compressibility and may be connected to leads of a test board respectively at lower distal ends 431 thereof by soldering.

Advantageous Effects

According to the socket apparatus for the semiconductor device test of the present invention, it is possible to propose a pressure means for strongly pressurizing an IC while maintaining a level position of an entire surface of the IC in response to contact force applied to leads of the semiconductor device. More particularly, it is possible to maximally open the pusher plate that functions as the pressure means so as to minimize interruption between the pusher plate and the IC when loading the IC in the socket apparatus.

Further, according to the socket apparatus for the semiconductor device test of the present invention, it is possible to propose a socket apparatus for more effectively testing the semiconductor device having an increased lead count, a reduced lead pitch, and reduced thickness thereof.

BEST MODE

Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the spirit and scope of the disclosure.

Hereinafter, preferred embodiments of the present disclosure will be described in detail with reference to the accompanying drawings.

Figure 1A:
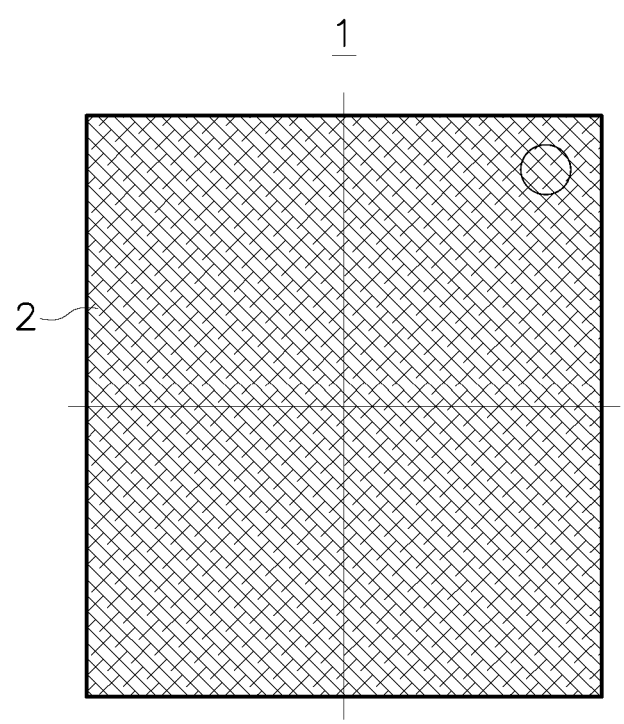
FIGS. 1a, 1b, and 1c are a plan view, a side view, and a bottom view respectively illustrating a typical IC.
Figure 1B:
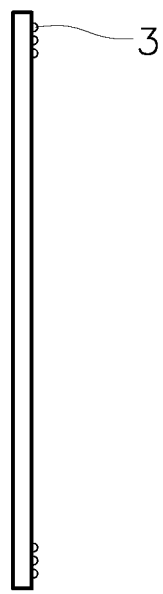
Figure 1C:
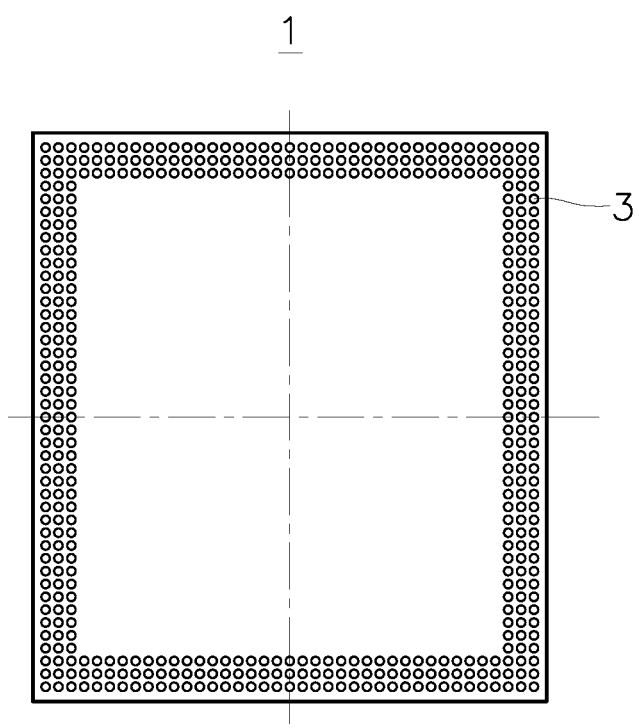
Figure 2A:
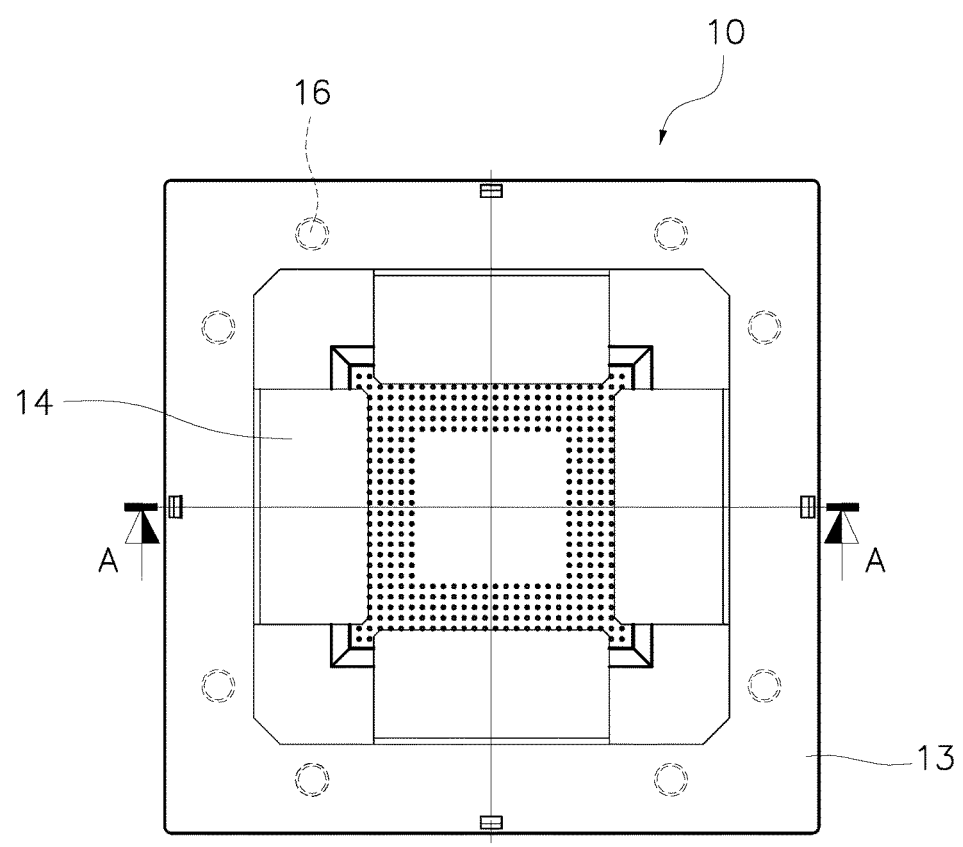
FIGS. 2a and b are a plan view and a cross-sectional view taken along line A-A of FIG. 2a respectively illustrating a socket apparatus for a semiconductor device test in the related art.
Figure 2B:
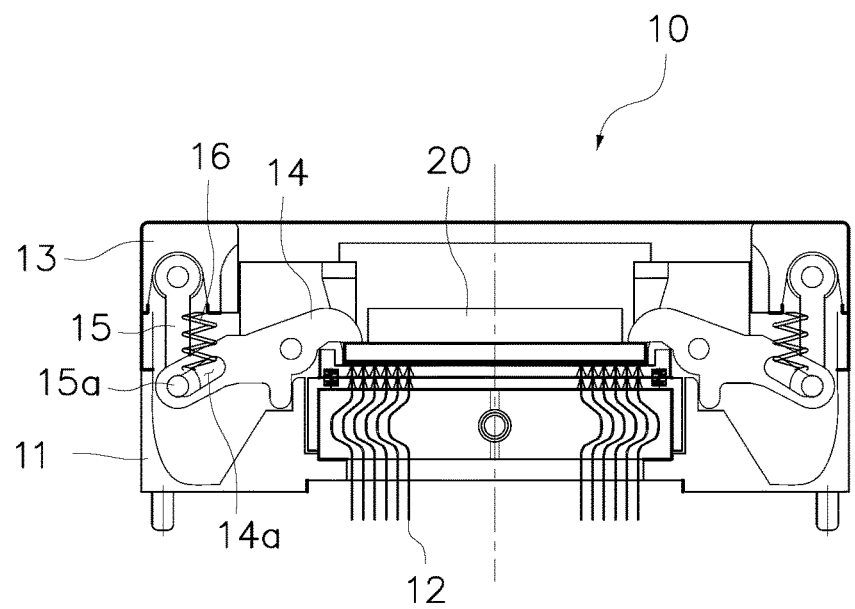
Figure 3:
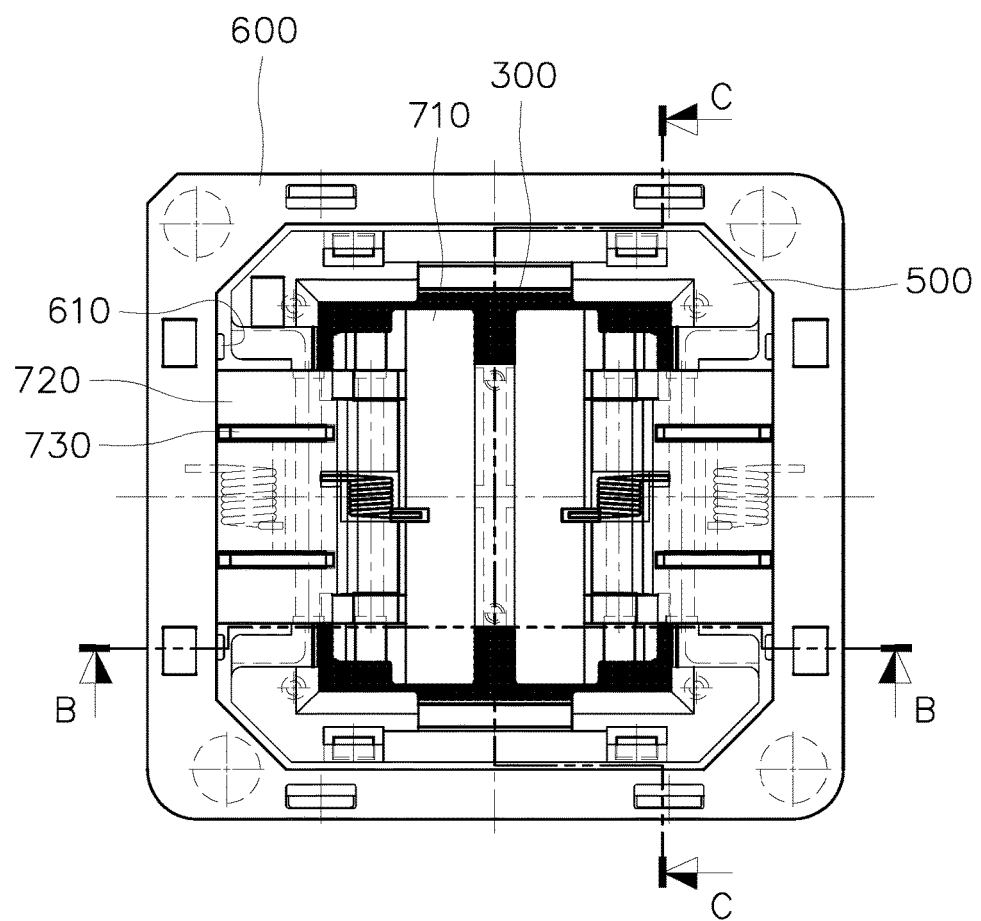
FIG. 3 is a plan view illustrating a socket apparatus for a semiconductor device test according to the present invention.
Figure 4:
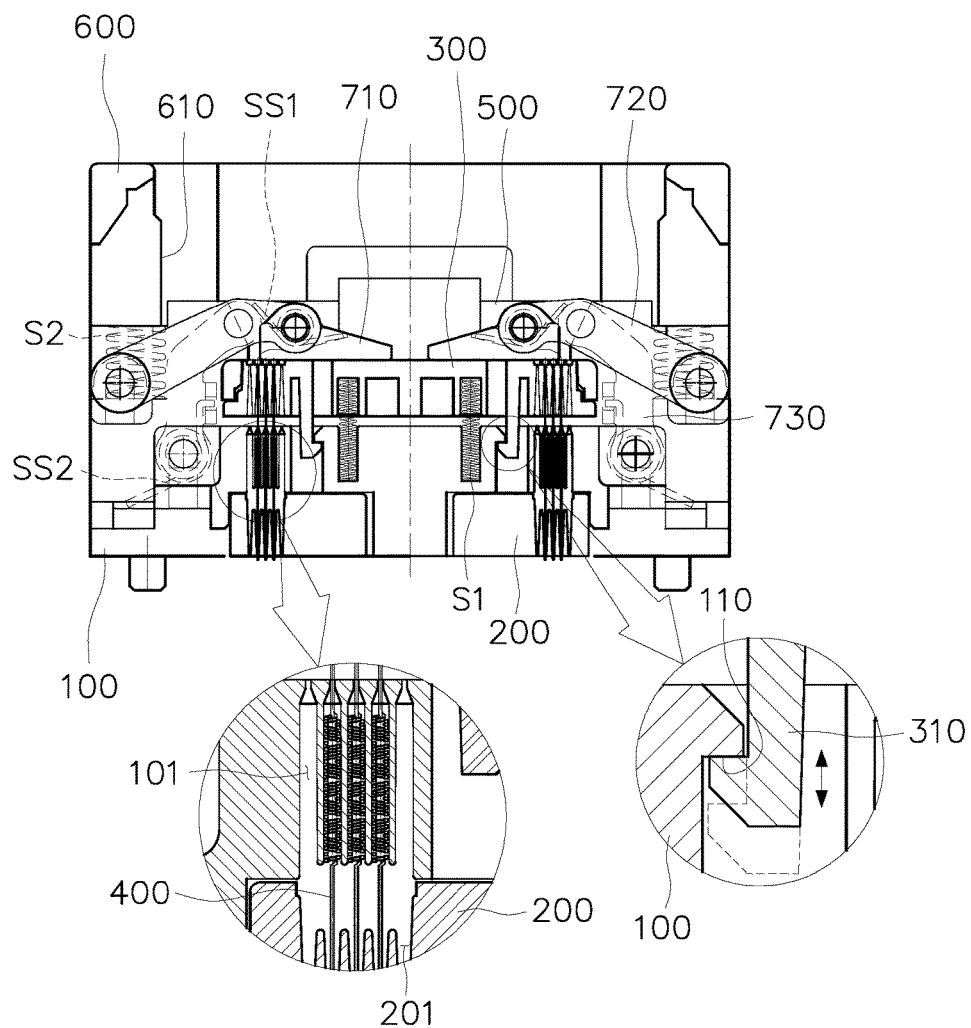
FIG. 4 is a cross-sectional view taken along line B-B of FIG. 3.
Figure 5:
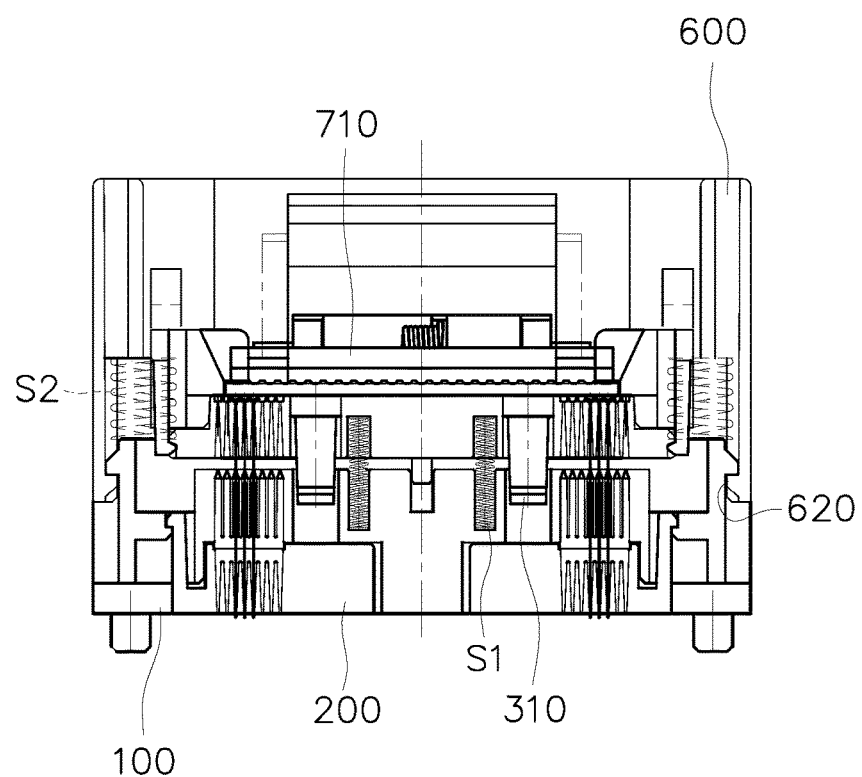
FIG. 5 is a cross-sectional view taken along line C-C of FIG. 3.

With reference to FIGS. 3 to 5, a socket apparatus for a semiconductor device test of the present invention includes: body elements 100 and 200 into which contacts 400 are fixedly inserted; movable elements 300 and 500 on which a semiconductor device IC is seated such that leads of the semiconductor device IC come into contact with upper ends of the contacts 400, the movable elements 300 and 500 being resiliently supported by the body elements 100 and 200 so as to be movable up and down within a preset height range; a socket cover 600 assembled to upper portions of the movable elements 300 and 500 and resiliently assembled to the body elements 100 and 200 so as to be movable up and down; and a semiconductor device pressing part 700 pressing and fixing the semiconductor device IC seated on the movable elements 300 and 500, while the semiconductor pressing part is operated in conjunction with movement of the socket cover 600 between upper and lower positions, in which the semiconductor device pressing part 700 includes: a pusher plate 710 having an opening cam 711 provided on a lower end of an inner wall structure of the socket cover 600 to come into contact with the inner wall structure when the socket cover 600 moves down, thus the pusher plate 710 comes into surface contact with an upper surface of the semiconductor device IC and applies pressure thereto; a latch 720 of which a first end is hingedly assembled to the socket cover 600 and a second end is hingedly assembled to the pusher plate 710; and a link 730 of which a first end is hingedly assembled to the socket body 100 and a second end is hingedly assembled to the latch 720.

Figure 6A:
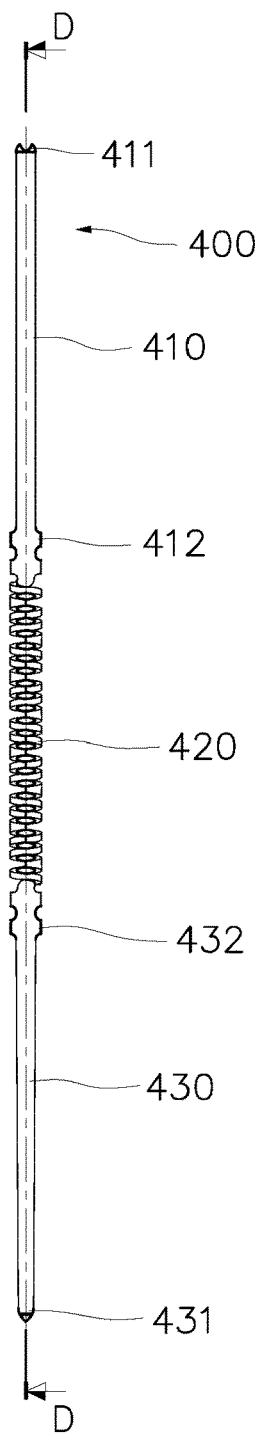
FIGS. 6a and 6b are a front view and a cross-sectional view taken along line D-D of FIG. 6a respectively illustrating the socket apparatus for the semiconductor device test according to the present invention.
Figure 6B:
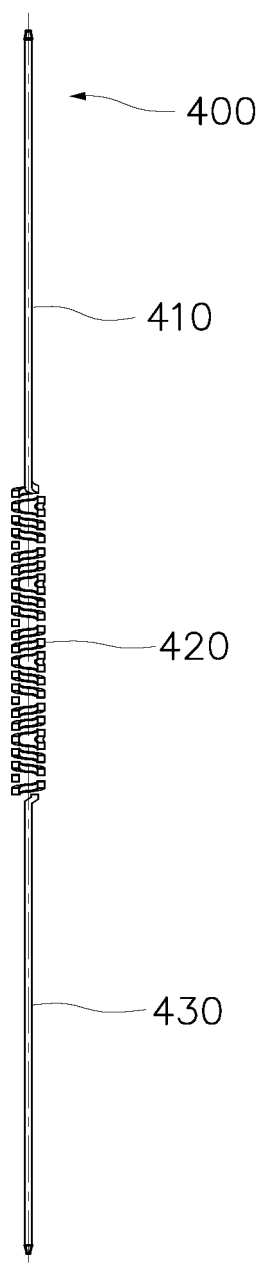

FIGS. 6a and 6b are a front view and a cross-sectional view taken along line D-D of FIG. 6a respectively illustrating the socket apparatus for the semiconductor device test of the present invention. With reference to FIGS. 6a and 6b, each of the contacts 400 includes an upper head portion 410 having an upper distal end 411 that is formed by protruding upwards, a compression portion 420 formed by spirally bending a strip from an upper shoulder portion 412 that extends downwards from the upper head portion 410, and a lower head portion 430 formed by extending from a lower shoulder portion 432 that extends from a lower end of the compression portion 420, with a lower distal end 431 provided on a lower end of the lower head portion 430.

Here, each of contacts 400 is a compressive contact having resilience in a lengthwise direction, and is formed as a single body by stamping a plate material. Further, the compression portion 420 may be a coil spring.

Next, in this embodiment, the body elements 100 and 200 are provided with a socket body 100 and a lower plate 200.

The socket body 100 substantially has a rectangular or quadrate shape and is provided with a plurality of first receiving holes 101 into which a plurality of contacts 400 are fixedly inserted. Here, the socket body 100 may be fixed to a test board (PCB, not shown) by a plurality of screws, such that lower contact portions of the contacts 400 supported by the socket body 100 respectively come into compressive contact with leads of the test board.

The lower plate 200 is provided in a lower portion of the socket body 100. Further, the lower plate 200 is provided with a plurality of second receiving holes 201 so as to communicate with the first receiving holes 101. Thus, the lower contact portions of the contacts 400 respectively come into electric contact with the leads of the PCB while passing through the second receiving holes 201.

Further, as described above, in order that lower contact portions of the contacts 400 respectively come into compressive contact with leads of the test board, generally the socket body 100 is fixed to the test board by screw-type engagement. However, a configuration of the socket apparatus, in which a guide plate having guide holes that guide leads of the contacts 400 is further provided in a lower side of the lower plate 200, and the lower contact portions of the contacts 400 extend further so as to be connected to the PCB by soldering, may be employed as a modification of this embodiment.

In this embodiment, the movable elements 300 and 500 are provided with a floating plate 300 and an adaptor plate 500.

The floating plate 300 is supported by a plurality of first elastic materials S1 at an upper location of the socket body 100 so as to be movable up and down. Further, the floating plate 300 includes an upper surface that serves as a seating surface to seat a semiconductor device IC thereon, and a plurality of through holes 301 where upper contact portions of the contacts 400 are held therein while passing through the floating plate 300.

Preferably, on a lower portion of the floating plate 300, a plurality of hooks 310 is provided. Further, on the socket body 100, a locking end 110 corresponding to each of the hooks 310 is protrudingly formed. Thus, the floating plate 300 that is movable up and down at the upper location of the socket body 100 moves up within a limited height range, while being resiliently supported by the first elastic materials S1.

The adaptor plate 500 is provided on an upper portion of the floating plate 300 and includes a guide surface that guides the semiconductor device IC to be seated on the floating plate 300.

Figure 7:
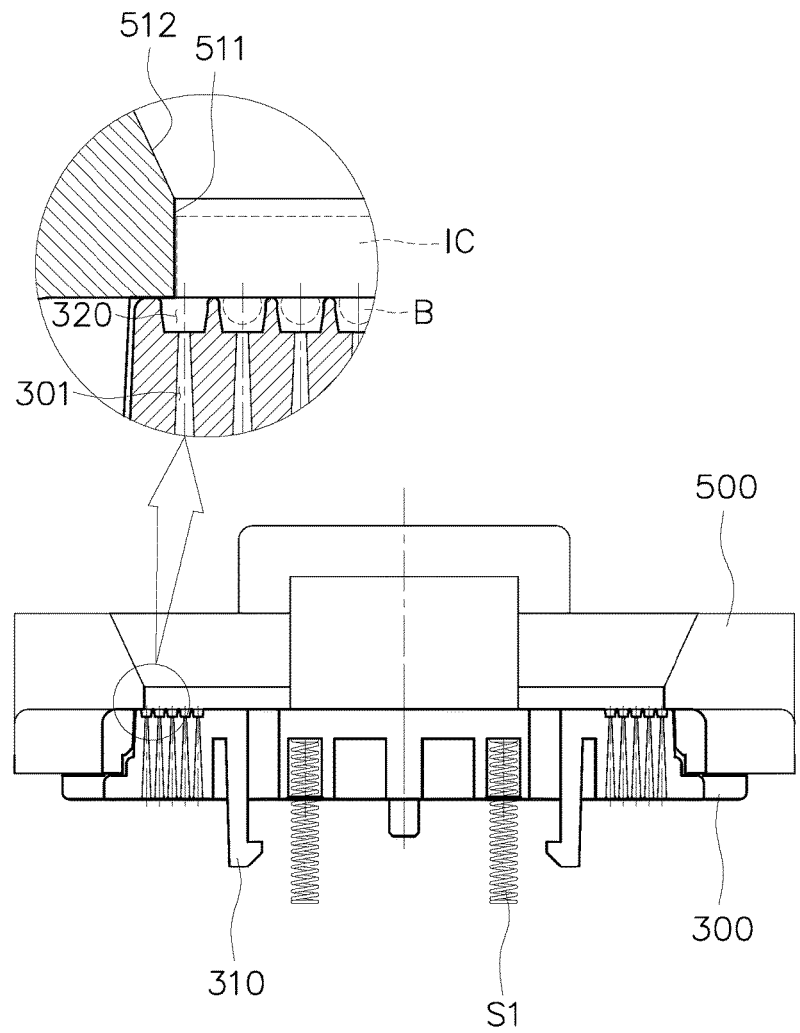
FIG. 7 is a cross-sectional view illustrating a configuration of movable elements according to a preferred embodiment of the present invention.

FIG. 7 is a cross-sectional view illustrating a configuration of the movable elements 300 and 500 according to a preferred embodiment of the present invention.

With reference to FIG. 7, the adaptor plate 500 has the guide surface including a vertical guide surface part 511 and an inclined guide surface part 512. Here, the vertical guide surface part 511 forms a side surface for surrounding the seating surface to seat the semiconductor device IC thereon, and the inclined guide surface part 512 discontinuously extends from the guide surface 511 with a predetermined angle in a lateral upward direction. Thus, the semiconductor device IC is guided along the inclined guide surface part 512 and the vertical guide surface part 511, thereby being loaded in a correct position.

Preferably, in the case of a BGA type IC, ball cups 320 that receive solder balls B of the semiconductor device IC in correct positions may be provided on the floating plate 300. Here, the ball cups 320 communicate with the through holes 301 where upper contact portions of the contacts 400 are held therein while passing through the floating plate 300.

With reference again to FIGS. 3 to 5, the socket cover 600 is resiliently supported by a plurality of second elastic materials S2, and is assembled to the socket body 100 by a plurality of second hooks 620 so as to be movable up and down on the socket body 100. Further, the socket cover 600 is provided with an opening 601 such that the semiconductor device IC is guided along the guide surface to be loaded on the floating plate 300.

Figure 8A:
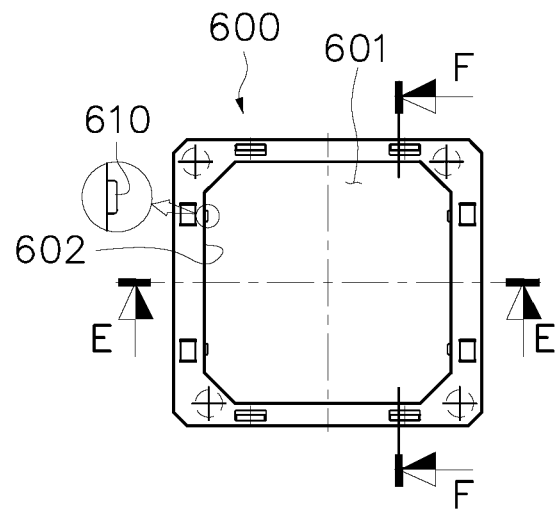
FIGS. 8a, 8b, 8c, and 8d are a plan view, a cross-sectional view taken along line F-F of FIG. 8a, a bottom view, and a cross-sectional view taken along line E-E of FIG. 8a respectively illustrating a socket cover provided in the socket apparatus for the semiconductor device test of the present invention.
Figure 8B:
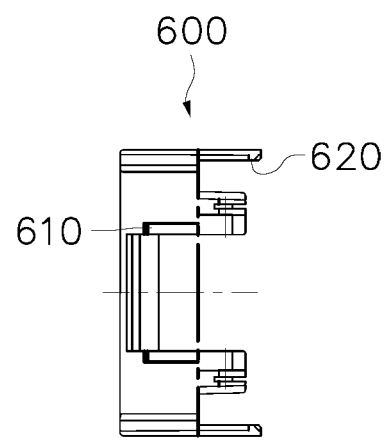
Figure 8C:
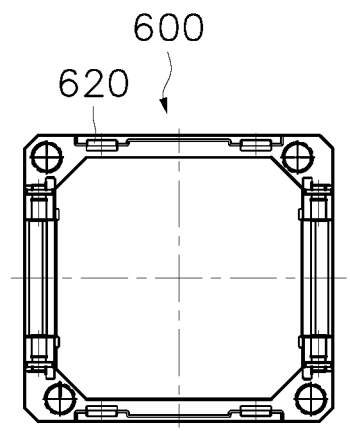
Figure 8D:
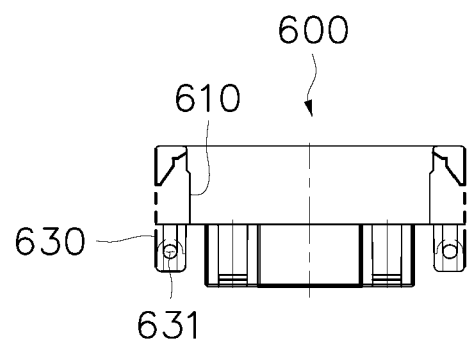

FIGS. 8a, 8b, 8c, and 8d are a plan view, a cross-sectional view taken along line F-F of FIG. 8a, a bottom view, and a cross-sectional view taken along line E-E of FIG. 8a respectively illustrating the socket cover 600 provided in the socket apparatus for the semiconductor device test of the present invention.

With reference to FIGS. 8a to 8d, the socket cover 600 has the same a rectangular or quadrate shape and a size as the socket body 100. Further, the socket cover 600 is provided with the opening 601 at a center thereof such that the semiconductor device IC is inserted thereto.

Preferably, an opening protrusion 610 is protrudingly formed on an inner surface of the socket cover 600 as an inner wall structure. Here, the opening protrusion 610 contributes to an opening operation of the semiconductor device pressing part 700. In the meantime, it should be understood that such inner wall structure may protrude on the inner surface of the socket cover 600, and a pressing operation with respect to the opening cam 711 of the semiconductor device pressing part 700 may be performed by a lower portion of the inner surface of the socket cover 600. In this regard, it will be described in detail with reference to the accompanying drawing.

The socket cover 600 is provided with a hinge bracket 630 formed by protruding at a lower end thereof. Here, the hinge bracket 630 is provided with a first hinge hole 631 such that a lower end of the latch 720 is rotatably assembled thereto by a hinge pin.

Referring again to FIGS. 3 to 5, the semiconductor device pressing part 700 presses and fixes the semiconductor device IC seated on the floating plate 300 while the semiconductor pressing part 700 is operated in conjunction with movement of the socket cover 600 between upper and lower positions of the socket cover 600. In this embodiment, the semiconductor device pressing parts 700 are symmetrically provided on opposite sides thereof. In this regard, it will be described using the same reference numeral for the symmetrical components. In the meantime, two or more semiconductor device pressing parts 700 may be provided in the present invention. For example, four semiconductor device pressing parts 700 may be symmetrically provided in left, right, front, and rear directions.

Specifically, the semiconductor device pressing part 700 is provided with the pusher plate 710, the latch 720, and the link 730.

The pusher plate 710 comes into surface contact with an upper surface of the semiconductor device IC and applies pressure thereto. Here, it may be desirable that two pusher plates 710 positioned on the left and right sides cover most of an entire upper surface of the semiconductor device IC so as to increase a contact area between the pusher plate 710 and the semiconductor device IC as much as possible.

The latch 720 is hingedly assembled to the socket cover 600 the pusher plate 710 at the first end and the second end thereof, respectively.

The link 730 is hingedly assembled to the socket body 100 and the latch 720 at the first end and the second end thereof, respectively.

Preferably, a hinge shaft between the pusher plate 710 and the latch 720 is resiliently supported by a first torsion spring SS1.

Further, a hinge shaft between the socket body 100 and the link 730 is resiliently supported by a second torsion spring SS2. Here, the first torsion spring SS1 and the second torsion spring SS2 enable the pusher plate 710 to maintain a closed state.

In such configuration of the semiconductor device pressing part 700, the hinge shaft of a lower end of the latch 720 moves up and down in conjunction with up and down movement of the socket cover 600 while a lower end of the link 730 serves as a fixed axis of rotation. Thus, an opening/closing operation of the pusher plate 710 is performed.

In particular, the pusher plate 710 of the present invention is characterized in that it is provided with the opening cam 711. Here, the opening cam 711 comes into direct contact with the socket cover 600 during an opening operation of the pusher plate 710, thereby increasing an opening rotation angle of the pusher plate 710.

Hereinafter, a configuration of the semiconductor device pressing part 700 will be described in detail.

Figure 9A:
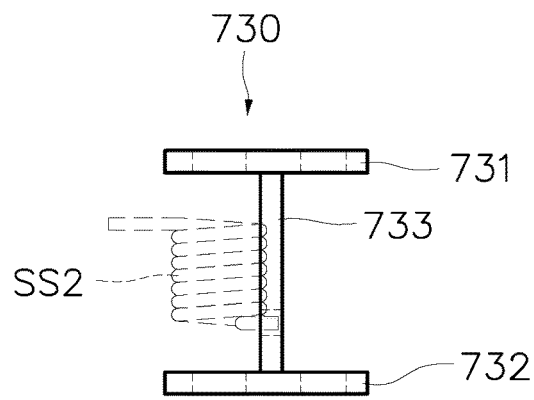
FIGS. 9a, 9b, and 9c are a plan view, a left side view, and a front view respectively illustrating a link provided in the socket apparatus for the semiconductor device test of the present invention.
Figure 9B:
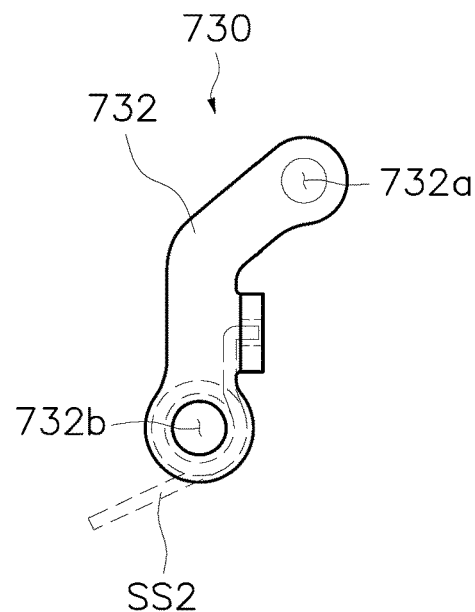
Figure 9C:
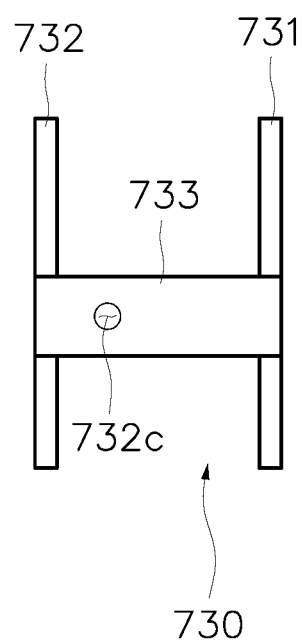
Figure 10A:
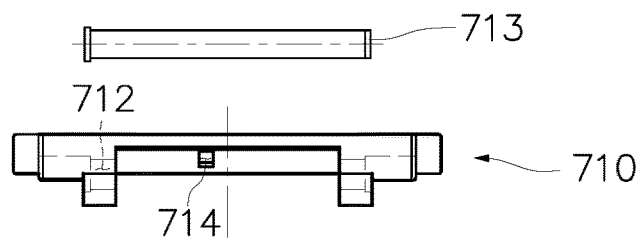
FIGS. 10a, 10b, 10c, 10d, and 10e are a front view, a plan view, a rear view, a bottom view, and a side view respectively illustrating a pusher plate provided in the socket apparatus for the semiconductor device test of the present invention.
Figure 10B:
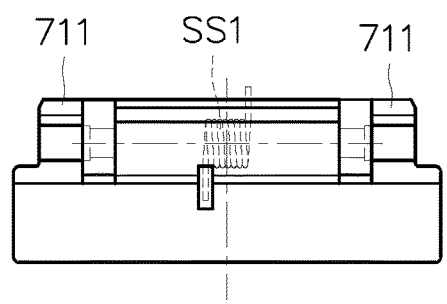
Figure 10C:
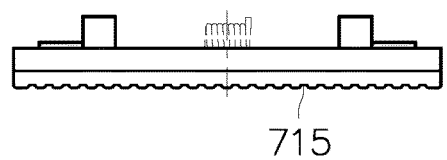
Figure 10D:
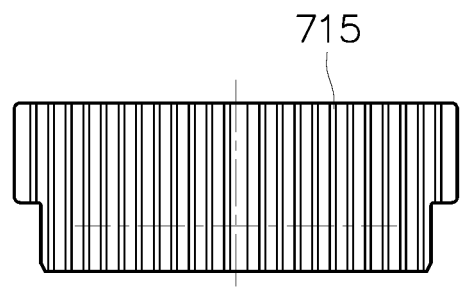
Figure 10E:
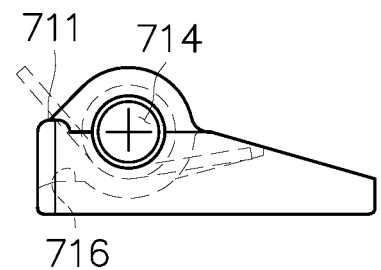

FIGS. 9a, 9b, and 9c are a plan view, a left side view, and a front view respectively illustrating the link 730 provided in the socket apparatus for the semiconductor device test of the present invention.

With reference to FIGS. 9a to 9c, the link 730 is provided with a pair of link plates 731 and 732 positioned parallel to each other and a fixing plate 733 fixing the link plates 731 and 732 to each other.

The link plates 731 and 732 are provided with a second hinge hole 732a and a third hinge hole 732b at an upper end and a lower end thereof respectively. Here, the second hinge hole 732a is assembled to the latch 720 by a hinge pin, and the third hinge hole 732b is assembled to the socket body 100 by a hinge pin.

Further, the fixing plate 733 may be provided with a fixing hole 732c that fixes an end of the second torsion spring SS2 thereto.

FIGS. 10a, 10b, 10c, 10d and 10e are a front view, a plan view, a rear view, a bottom view, and a side view respectively illustrating the pusher plate 710 provided in the socket apparatus for the semiconductor device test of the present invention.

With reference to FIGS. 10a to 10e, the pusher plate 710 is provided with an axial hole 712 so as to be hingedly assembled to the latch 720, such that the pusher plate 710 is rotatably assembled to the latch 720 by a hinge pin 713.

Further, the opening cam 711 is formed by protruding upward at a rear end of the axial hole 712. Here, the opening cam 711 is relatively pressurized by the opening protrusion 610 of the socket cover 600 during the opening operation of the pusher plate 710, thereby increasing the opening rotation angle of the pusher plate 710.

The pusher plate 710 is provided with a groove 714 that fixes an end of the first torsion spring SS1 thereto.

Further, on a lower surface of the pusher plate 710 that comes into contact with and applies pressure to the semiconductor device IC, the pusher plate 710 is provided with a plurality of uneven portions 715 formed along a rotating direction of the pusher plate 710, thereby reducing friction force caused when the pusher plate 710 comes into contact with and applies pressure to the semiconductor device IC.

Further, the pusher plate 710 may be provided with a rotation stop surface 716 that comes into contact with the latch 720 and limits a rotation angle of the pusher plate 710. Preferably, if the rotation angle is limited during a loading process of the semiconductor device IC, a front end of the pusher plate 710 is firstly brought into contact with and presses the upper surface of the semiconductor device IC in an initial stage of pressurizing the semiconductor device IC.

Figure 11A:
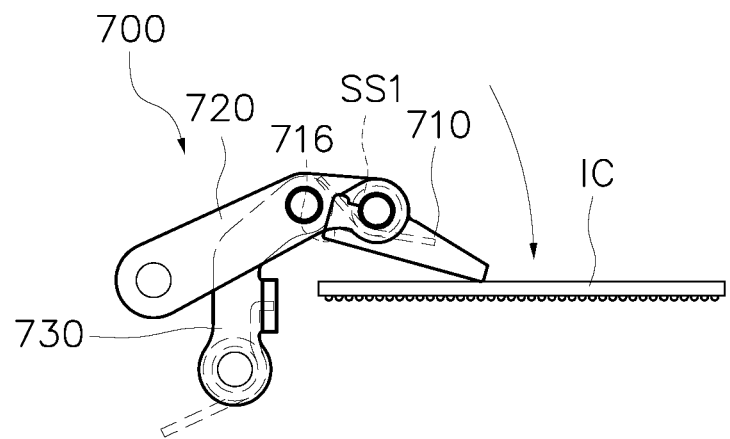
FIGS. 11a and 11b are views illustrating an initial stage of pressurizing the semiconductor device, performed by operation of the pusher plate of a semiconductor device pressing part.
Figure 11B:
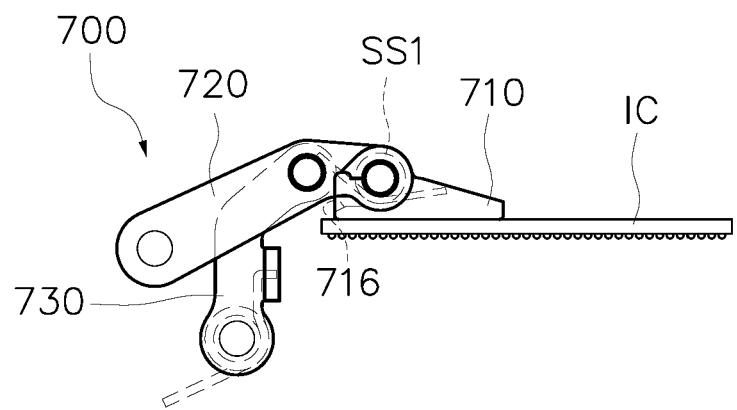

FIGS. 11a and 11b are views illustrating the initial stage of pressurizing the semiconductor device IC, performed by operation of the pusher plate 710 of the semiconductor device pressing part 700. In order to help understand the present invention, only one semiconductor device pressing part 700 is shown in the drawing.

With reference to FIG. 11a, in the initial stage of pressurizing the semiconductor device IC after the loading process thereof, a rotation of the pusher plate 710 is performed while an end of the pusher plate 710 faces downwards and the rotation stop surface 716 of the pusher plate 710 comes into contact with the latch 720 by resilience of the first torsion spring SS1, such that the end of the pusher plate 710 is firstly brought into contact with the semiconductor device IC.

In the meantime, With reference to FIG. 11b, the pusher plate 710 continuously rotates in a pressure direction thereof, and then the entire surface of the pusher plate 710 is brought into full contact with the semiconductor device IC, thereby reliably securing the semiconductor device IC. Here, the rotation stop surface 716 of the pusher plate 710 is spaced apart from the latch 720.

As such, when compared with the fact that the entire surface of the pusher plate 710 comes into contact with the semiconductor device IC in the initial stage of pressurizing the semiconductor device IC, there is a difference in that the front end of the pusher plate 710 is firstly brought into contact with the semiconductor device IC.

Thus, the semiconductor device IC is stably secured in the socket apparatus regardless of thickness thereof.

FIGS. 12a, 12b, 12c, and 12d are views illustrating the loading process of the semiconductor device IC.

Figure 12A:
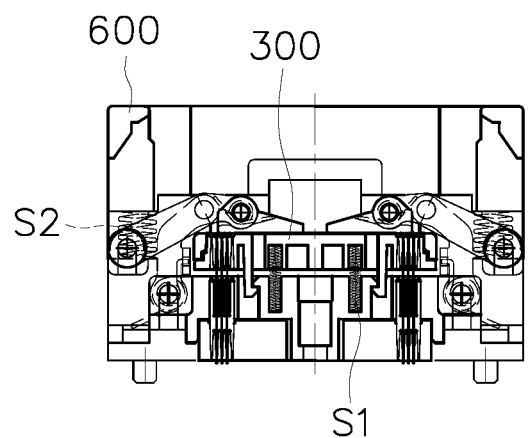
FIGS. 12a, 12b, 12c, and 12d are views illustrating a loading process of the semiconductor device.

FIG. 12a shows a natural state of the socket apparatus. Here, the socket cover 600 and the floating plate 300 are positioned upwards by the second elastic materials S2 and the first elastic materials S1, respectively.

Figure 12B:
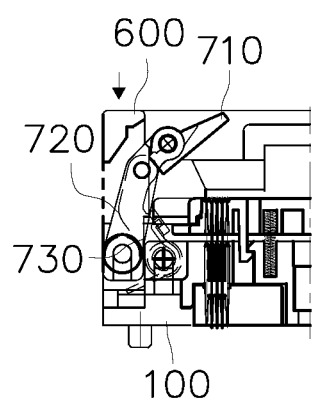

FIG. 12b shows a state in which the socket cover 600 is pressed. Here, the lower end of the latch 720 that is hingedly assembled to the socket cover 600 moves down in conjunction with a rotation of the link 730 while the lower end of the link 730 that is hingedly assembled to the socket body 110 is served as the fixed axis of rotation. Thus, the pusher plate 710 rotates from the center of the socket apparatus towards the outside.

Figure 12C:
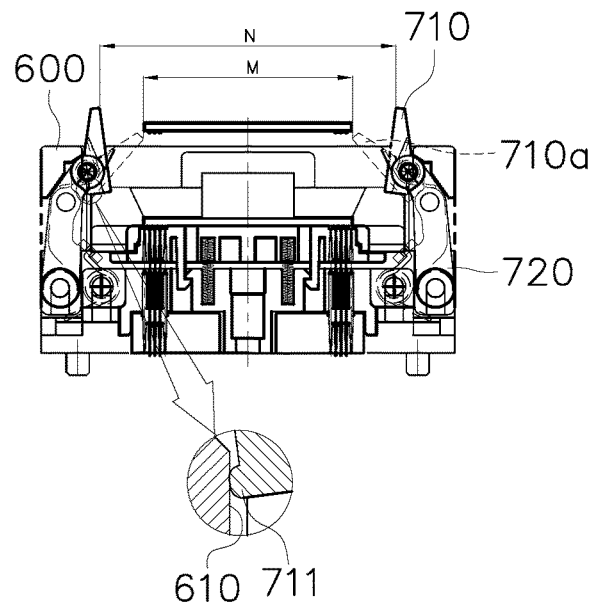

FIG. 12c shows a state in which the socket cover 600 is maximally pressed. Here, the pusher plate 710 rotates with a hinge shaft assembled between an upper end of the latch 720 and the pusher plate 710 while the opening cam 711 is pressed by the opening protrusion 610 of the socket cover 600. Thus, the pusher plate maximally rotates outwards to be opened.

For the reference, a pusher plate 710a illustrated by a dotted line in FIG. 12c is in a state in which the socket cover 600 is pressed with the same displacement without having the opening cam 711. Here, it is known that an opening distance M of the pusher plate 710a is smaller than an opening distance N of the present invention. Thus, the present invention can secure a maximum opening rotation angle of the pusher plate 710, thereby preventing interruption between the semiconductor device IC and the pusher plate 710 when loading the semiconductor device IC.

Figure 12D:
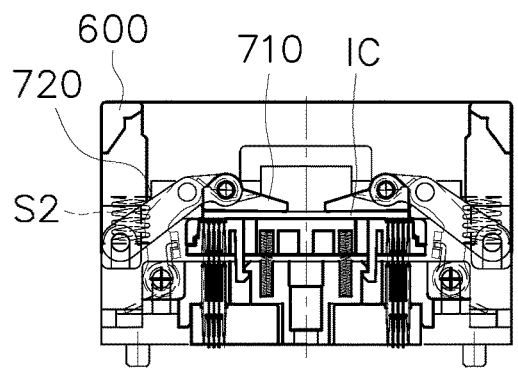

With reference to FIG. 12d, when removing pressing force applied to the socket cover 600 after completion of loading the semiconductor device IC, the socket cover 600 moves upwards such that the lower end of the latch 720, which is hingedly assembled to the socket cover 600, moves in conjunction with movement of the socket cover 600. Then, while the latch 720 is closed, the pusher plate 710 pressurizes the semiconductor device IC. Thus, a test on the semiconductor device IC is performed.

In the meantime, as described in FIG. 11, it may be desirable that the front end of the pusher plate 710 is firstly brought into contact with the upper surface of the semiconductor device IC in the initial stage of pressurizing the semiconductor device IC such that the entire lower surface of the pusher plate 710 pressurizes the semiconductor device IC.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

DESCRIPTION OF THE REFERENCE NUMERALS IN THE DRAWINGS

| | |
|---|---|
| 100: socket body | 101: first receiving hole |
| 110: locking end | 200: lower plate |
| 201: second receiving hole | 300: floating plate |
| 301: through hole | 310: hook |
| 400: contact | 500: adaptor plate |
| 600: socket cover | 610: opening protrusion |
| 700: semiconductor device pressing part | |
| 710: pusher plate | |
| 730: link | S1: first elastic material |
| S2: second elastic material | SS1: first torsion spring |
| SS2: second torsion spring | |

What is claimed is:

1. A socket apparatus for a semiconductor device test, the socket apparatus comprising:
a socket body (100) provided with a plurality of first receiving holes (101) for receiving contacts therein;
a lower plate (200) provided in a lower portion of the socket body (100), the lower plate (200) being provided with a plurality of second receiving holes (201) that is formed through the lower plate (200) and respectively communicates with the first receiving holes (101) such that lower contact portions of the contacts (400) come into electric contact with leads of a printed circuit board (PCB);
a floating plate (300) supported by a plurality of first elastic materials (S1) at an upper location of the socket body (100) so as to be movable up and down, the floating plate (300) having an upper surface serving as a seating surface to seat a semiconductor device thereon, and a plurality of through holes (301) where upper contact portions of the contacts are held therein while passing through the floating plate (300);
the plurality of contacts (400) inserted into the first receiving holes (101) and the second receiving holes (201) such that the lower contact portions of the contacts (400) come into contact with the leads of the PCB, and the upper contact portions of the contacts (400) come into contact with leads of the semiconductor device through the through holes (301);
an adaptor plate (500) provided on an upper portion of the floating plate (300), the adaptor plate (500) having a guide surface that guides the semiconductor device to be seated on the floating plate (300);
a socket cover (600) supported by a plurality of second elastic materials (S2) and assembled to the socket body (100) by a plurality of hooks (620) so as to be movable up and down on the socket body (100), the socket cover (600) having an opening (601) such that the semiconductor device is guided along the guide surface to be loaded on the floating plate (300), wherein an inner surface of the opening (601) is provided with an opening protrusion (610) formed by protruding therefrom; and
a semiconductor pressing part (700) pressing and fixing the semiconductor device seated on the floating plate (300), while the semiconductor pressing part is operated in conjunction with movement of the socket cover (600) between upper and lower positions,
wherein the semiconductor device pressing part (700) includes:
a latch of which a first end is hingedly coupled to the socket cover;
a pusher plate (710) hingedly coupled to a second end of the latch such that the pusher plate is rotatable on the second end of the latch, the pusher plate having an opening cam (711) protruding from an end thereof such that when the socket cover is pressed, the opening cam comes into contact with the opening protrusion whereby the pusher plate is maximally opened, wherein the pusher plate (710) is configured to contact with an upper surface of the semiconductor device and applies pressure thereto;
and
a link (730) of which a first end is hingedly assembled to the socket body (100) and a second end is hingedly coupled to a middle portion of the latch (720), and
wherein the latch, the pusher plate and the link are separated from each other.

2. A socket apparatus for a semiconductor device test, the socket apparatus comprising:
body elements (100, 200) into which contacts (400) are fixedly inserted;
movable elements (300, 500) on which a semiconductor device (IC) is seated such that leads of the semiconductor device come into contact with upper ends of the contacts (400), the movable elements (300, 500) being resiliently supported by the body elements (100, 200) so as to be movable up and down within a preset height range;
a socket cover (600) assembled to upper portions of the movable elements (300, 500) and resiliently assembled to the body elements (100, 200) so as to be movable up and down; and
a semiconductor device pressing part configured to press and fix the semiconductor device (IC) seated on the movable elements (300, 500),
wherein the semiconductor device pressing part (700) includes:
a latch of which a first end is hingedly coupled to the socket cover;
a pusher plate (710) hingedly coupled to a second end of the latch such that the pusher plate is rotatable on the second end of the latch, wherein the pusher plate (710) is configured to contact with an upper surface of the semiconductor device (IC) and applies pressure thereto;
and
a link (730) of which a first end is hingedly assembled to the socket body (100) and a second end is hingedly coupled to a middle portion of the latch (720), and
wherein the latch, the pusher plate and the link are separated from each other.

3. The socket apparatus of claim 1, wherein a hinge shaft between the pusher plate (710) and the latch (720) is resiliently supported by a first torsion spring (SS1).

4. The socket apparatus of claim 1, wherein a hinge shaft between the socket body (100) and the link (730) is resiliently supported by a second torsion spring (SS2).

5. The socket apparatus of claim 2, wherein a hinge shaft between the body elements (100, 200) and the link (730) is resiliently supported by a second torsion spring (SS2).

6. The socket apparatus of claim 3, wherein the pusher plate (710) includes a rotation stop surface (716) that comes into contact with the latch (720) and limits a rotation angle of the pusher plate (710), such that a front end of the pusher plate (710) is firstly brought into contact with the upper surface of the semiconductor device in an initial stage of pressurizing the semiconductor device.

7. The socket apparatus of claim 1, wherein the floating plate (300) of which the seating surface where the semiconductor device is seated thereon is provided with ball cups (320) formed by indenting the upper surface of the floating plate (300) so as to communicate with the through holes (301) of the floating plate (300) and receive the leads of the semiconductor device therein.

8. The socket apparatus of claim 4, wherein the link (730) includes:
two link plates (731, 732) positioned parallel to each other, the link plates (731, 732) of which upper and lower ends are provided with hinge holes so as to be assembled to the latch (720) and the socket body (100) respectively by hinge pins; and
a fixing plate (733) fixing the link plates (731, 732) to each other, and having a fixing hole that fixes an end of the second torsion spring (SS2) thereto.

9. The socket apparatus of claim 1, wherein each of the contacts (400) is integrally formed by stamping a plate material, and includes:
an upper head portion (410) having an upper distal end (411) that is formed by protruding upwards;
a compression portion (420) formed by spirally bending a strip from an upper shoulder portion (412) that extends downwards from the upper head portion (410); and
a lower head portion (430) formed by extending from a lower shoulder portion (432) that extends from a lower end of the compression portion (420), with a lower distal end (431) provided on a lower end of the lower head portion (430).

10. The socket apparatus of claim 9, wherein the compression portion (420) is a coil spring.

11. The socket apparatus of claim 1, wherein, on a lower surface of the pusher plate (710) that comes into contact with and applies pressure to the semiconductor device, the pusher plate (710) includes a plurality of uneven portions (715) formed along a rotating direction of the pusher plate (710).

12. The socket apparatus of claim 1, wherein the socket body (100) is mounted to a test board by a plurality of screws, and the contacts (400) have compressibility and come into compressive contact with leads of the test board respectively at lower distal ends (431) thereof.

13. The socket apparatus of claim 1, further comprising:
a guide plate provided at a lower side of the lower plate (200), the guide plate having contact guide holes that guide the contacts,
wherein the contacts (400) have compressibility and are respectively connected to leads of a test board at lower distal ends (431) thereof by soldering.

14. The socket apparatus of claim 2, wherein a hinge shaft between the pusher plate (710) and the latch (720) is resiliently supported by a first torsion spring (SS1).

15. The socket apparatus of claim 2, wherein each of the contacts (400) is integrally formed by stamping a plate material, and includes:
an upper head portion (410) having an upper distal end (411) that is formed by protruding upwards;
a compression portion (420) formed by spirally bending a strip from an upper shoulder portion (412) that extends downwards from the upper head portion (410); and
a lower head portion (430) formed by extending from a lower shoulder portion (432) that extends from a lower end of the compression portion (420), with a lower distal end (431) provided on a lower end of the lower head portion (430).

16. The socket apparatus of claim 15, wherein the compression portion (420) is a coil spring.

17. The socket apparatus of claim 2, wherein, on a lower surface of the pusher plate (710) that comes into contact with and applies pressure to the semiconductor device, the pusher plate (710) includes a plurality of uneven portions (715) formed along a rotating direction of the pusher plate (710).

18. A socket apparatus for a semiconductor device test, the socket apparatus comprising:
a socket body provided with a plurality of first receiving holes for receiving contacts therein;
a lower plate provided in a lower portion of the socket body, the lower plate being provided with a plurality of second receiving holes that is formed through the lower plate and respectively communicates with the first receiving holes such that lower contact portions of the contacts come into electric contact with leads of a printed circuit board (PCB);

a floating plate supported by a plurality of first elastic materials at an upper location of the socket body so as to be movable up and down, the floating plate having an upper surface serving as a seating surface to seat a semiconductor device thereon, and a plurality of through holes where upper contact portions of the contacts are held therein while passing through the floating plate;

the plurality of contacts inserted into the first receiving holes and the second receiving holes such that the lower contact portions of the contacts come into contact with the leads of the PCB, and the upper contact portions of the contacts come into contact with leads of the semiconductor device through the through holes;

an adaptor plate provided on an upper portion of the floating plate, the adaptor plate having a guide surface that guides the semiconductor device to be seated on the floating plate;

a socket cover supported by a plurality of second elastic materials (S2) and assembled to the socket body by a plurality of hooks so as to be movable up and down on the socket body, the socket cover having an opening such that the semiconductor device is guided along the guide surface to be loaded on the floating plate, wherein an inner surface of the opening is provided with an opening protrusion formed by protruding therefrom; and a semiconductor pressing part pressing and fixing the semiconductor device seated on the floating plate, while the semiconductor pressing part is operated in conjunction with movement of the socket cover between upper and lower positions, wherein the semiconductor device pressing part includes:

a pusher plate having an opening cam protruding from an end thereof to contact with the opening protrusion, wherein the pusher plate is configured to contact with an upper surface of the semiconductor device and applies pressure thereto;

a latch of which a first end is hingedly assembled to the socket cover and a second end is hingedly assembled to the pusher plate; and a link of which a first end is hingedly assembled to the socket body and a second end is hingedly assembled to the latch, the link including two link plates positioned parallel to each other and having hinge holes at upper and lower ends so as to be assembled to the latch and the socket body respectively by hinge pins, and a fixing plate fixing the link plates to each other and having a fixing hole for fixing an end of a first torsion spring thereto.

19. The socket apparatus of claim 18, wherein a hinge shaft between the pusher plate and the latch is resiliently supported by a second torsion spring.

20. The socket apparatus of claim 18, wherein a hinge shaft between the socket body and the link is resiliently supported by the first torsion spring.

* * * * *